US 10,775,834 B2

(12) United States Patent
Wu

(10) Patent No.: US 10,775,834 B2
(45) Date of Patent: Sep. 15, 2020

(54) CLOCK PERIOD TUNING METHOD FOR RC CLOCK CIRCUITS

(71) Applicant: MACRONIX INTERNATIONAL CO., LTD., Hsinchu (TW)

(72) Inventor: Hsien-Hung Wu, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/502,655

(22) Filed: Jul. 3, 2019

(65) Prior Publication Data

US 2020/0125133 A1 Apr. 23, 2020

Related U.S. Application Data

(60) Provisional application No. 62/749,136, filed on Oct. 23, 2018.

(51) Int. Cl.
| | | |
|---|---|---|
| *G06F 1/08* | (2006.01) | |
| *G05F 1/10* | (2006.01) | |
| *H03C 3/09* | (2006.01) | |
| *H03L 7/07* | (2006.01) | |
| *H03L 7/097* | (2006.01) | |

(52) U.S. Cl.
CPC ............ *G06F 1/08* (2013.01); *H03C 3/0966* (2013.01); *H03L 7/07* (2013.01); *H03L 7/097* (2013.01)

(58) Field of Classification Search
CPC combination set(s) only.
See application file for complete search history.

(56) References Cited

U.S. PATENT DOCUMENTS

| | | |
|---|---|---|
| 5,347,224 A | 9/1994 | Brokaw |
| 5,838,183 A | 11/1998 | Ishizaka |
| 6,092,217 A | 7/2000 | Kanekawa et al. |
| 6,434,707 B1 | 8/2002 | Eklof |
| 6,854,068 B2 | 2/2005 | Ishibe et al. |
| 6,933,754 B2 | 8/2005 | Restle |
| 7,075,353 B1 | 7/2006 | Wan et al. |
| 7,142,005 B1 | 11/2006 | Gaboury |
| 7,558,390 B2 | 7/2009 | Nielsen et al. |
| 7,656,145 B2 | 2/2010 | Xiao et al. |
| 7,932,639 B2 | 4/2011 | Ma et al. |
| 7,961,027 B1 | 6/2011 | Chen et al. |
| 8,148,967 B2 | 4/2012 | Xing et al. |
| 8,217,698 B2 | 7/2012 | Chen et al. |
| 8,245,074 B2 | 8/2012 | Chen et al. |
| 8,261,120 B2 | 9/2012 | Chen et al. |
| 8,589,716 B2 | 11/2013 | Chen et al. |

(Continued)

OTHER PUBLICATIONS

U.S. Appl. No. 15/858,783 Non-Final Action dated Oct. 3, 2019, 6 pages.

*Primary Examiner* — An T Luu
(74) *Attorney, Agent, or Firm* — Haynes Beffel & Wolfeld LLP

(57) ABSTRACT

A circuit generates a clock signal with a tunable clock period. The circuit comprises capacitors, first tuning circuitry and second tuning circuitry. The first tuning circuitry is configured to adjust the clock period with a first period tuning step based on a first parameter and the second tuning circuit is configured to adjust the clock period with a second period tuning step based on a second parameter. The first period tuning step is different than the second period tuning step.

20 Claims, 12 Drawing Sheets

(56) References Cited

U.S. PATENT DOCUMENTS

| | | |
|---|---|---|
| 8,736,331 B2 | 5/2014 | Chen |
| 8,819,473 B2 | 8/2014 | Chen et al. |
| 9,099,994 B2 * | 8/2015 | Thomsen ............. H03K 3/0231 |
| 9,270,272 B2 | 2/2016 | Chen et al. |
| 9,876,502 B2 | 1/2018 | Chen et al. |
| 2002/0199125 A1 | 12/2002 | Chieco et al. |
| 2008/0100391 A1 | 5/2008 | Lim et al. |
| 2008/0278124 A1 | 11/2008 | Aiura et al. |
| 2009/0160410 A1 | 6/2009 | Al-Shyoukh et al. |
| 2010/0270997 A1 | 10/2010 | Riedel |
| 2011/0291638 A1 | 12/2011 | Chen |
| 2018/0123592 A1 | 5/2018 | Chen et al. |

* cited by examiner

TABLE I

| SWITCH IN FIRST TRIMMING RESISTOR | CM PARAMETER ON | CM PARAMETER OFF |
|---|---|---|
| t0 ON | R | 1.2R |
| t1 ON | 2R | 2.4R |
| t2 ON | 3R | 3.6R |
| t3 ON | 4R | 4.8R |
| t4 ON | 5R | 6.0R |
| t5 ON | 6R | 7.2R |
| t6 ON | 7R | 8.4R |
| t7 ON | 8R | 9.6R |
| t8 ON | 9R | 10.8R |
| t9 ON | 10R | 12R |
| t10 ON | 11R | 13.2R |
| t11 ON | 12R | 14.4R |
| t12 ON | 13R | 15.6R |
| t13 ON | 14R | 16.8R |
| t14 ON | 15R | 18R |
| ALL ON | 16R | 19.2R |

TABLE II

| SWITCH IN FIRST TRIMMING RESISTOR | SWITCH IN SECOND TRIMMING RESISTOR | RESISTANCE |
|---|---|---|
| t0 ON | s0 ON | R |
| t0 ON | s1 ON | 1.25R |
| t0 ON | s2 ON | 1.5R |
| t0 ON | ALL OFF | 1.75R |
| t1 ON | s0 ON | 2R |
| t1 ON | s1 ON | 2.25R |
| t1 ON | s2 ON | 2.5R |
| t1 ON | ALL OFF | 2.75R |
| t2 ON | s0 ON | 3R |
| t2 ON | s1 ON | 3.25R |
| t2 ON | s2 ON | 3.5R |
| t2 ON | ALL OFF | 3.75R |
| t3 ON | s0 ON | 4R |
| t3 ON | s1 ON | 4.25R |
| t3 ON | s2 ON | 4.5R |
| t3 ON | ALL OFF | 4.75R |

CLOCK PERIOD TUNING METHOD FOR RC CLOCK CIRCUITS

PRIORITY APPLICATION

This application claims the benefit of U.S. Provisional Patent Application No. 62/749,136 filed 23 Oct. 2018; which application is incorporated herein by reference.

BACKGROUND

Technological Field

The present technology relates to clock circuits, including such clock circuits formed on an integrated circuit and providing a stable operating frequency for circuitry on the integrated circuit.

Description of Related Art

In many integrated circuit based systems, it is important to provide clock signals with a stable operating frequency or clock period. An RC clock circuit may be applied to various integrated circuits for providing the required clock signals. The RC clock circuit can be highly integrated with other on-chip components and generally require no external components. FIG. 1A is a circuit diagram illustrating an example of an RC clock circuit 100. In the RC clock circuit 100, a clock trimming resistor Rc 104 controls the current Ir flowing through a transistor Mr. Transistors M1, M2, and Mr form current mirrors to establish the currents I1, I2, and Ir in response to the reference voltage Vref. The reference voltage Vref is a bias voltage of the transistors M1, M2, and Mr, and is thereby used to control the rate of alternate charging and discharging of the capacitors C1 and C2. A switching circuit in this example includes a pair of comparators 130 and 140, a NAND gate 110, a D flip-flop 120, and two switches SW11 and SW22. The comparator 130 compares the voltage at the node Vcap1 of the capacitor C1 with the reference voltage Vref and generates a signal cmp1 that is then sent to the NAND gate 110. For example, if the voltage at the node Vcap1 is higher than the reference voltage Vref, the signal cmp1 is at a high level. Otherwise, the signal cmp1 is at a low level. The comparator 140 compares the voltage at the node Vcap2 of the capacitor C2 with the reference voltage Vref and generates a signal cmp2. The signal cmp2 is then sent to the NAND gate 110. For example, if the voltage at the node Vcap2 is higher than the reference voltage Vref, the signal cmp2 is at a high level. Otherwise, the signal cmp2 is at a low level. The signal SW1 output from the D flip-flop 120 is used to enable or disable switch SW11. For example, if the signal SW1 is at a high level, the switch SW11 is enabled (i.e., conducting). Otherwise, the switch SW11 is disabled (i.e., not conducting). The signal SW2 output from the D flip-flop 120 is used to enable or disable switch SW22. For example, if the signal SW2 is at a high level, the switch SW22 is enabled. Otherwise, the switch SW22 is disabled.

When the signal SW1 is at a high level and the signal SW2 is at a low level, the capacitor C1 is charged toward VDD (Vcap1=VDD) by enabling the switch SW11, and the capacitor C2 starts to discharge from VDD toward ground, according to the discharge current I2 by turning off the switch SW22. Before the voltage Vcap2 at the capacitor C2 is discharged, both of the signals cmp1 and cmp2 output from comparators 130, 140 are kept high because the voltages Vcap1 and Vcap2 are both higher than Vref, such that no signal transitions on the clock input end of the D flip-flop 120, and the signal SW1 and the signal SW2 maintain their previous voltage levels. When the voltage Vcap2 on the capacitor C2 is discharged below Vref, the signal cmp2 changes from a high level to a low level and a rising edge occurs on the clock input end of the D flip-flop 120, such that the signal SW1 changes to a low level and the signal SW2 changes to a high level. Therefore the capacitor C2 is charged toward VDD (Vcap2=VDD) immediately by turning on the switch SW22 and turning off the switch SW11. The capacitor C1 starts to discharge from VDD to Vref, according to the discharge current I1. In this manner, the switching circuit alternately charges and discharges the capacitors C1 and C2 between VDD and Vref.

In the circuit of FIG. 1A, the clock rate is a function of the voltage Vref, because it sets the range of the voltage swing on the capacitors and the magnitude of the discharge current.

FIG. 1B illustrates an example of the clock trimming resistor Rc 104 with an adjustable resistance. The resistance of the clock trimming resistor Rc 104 is adjusted by a trim code in order to set the clock period of the clock circuit 100 at some desired target clock period. The clock trimming resistor Rc 104 includes a number of tunable switches adjusted by 6-bit trim code. A decoder 108 generates signals to enable the switches in the clock trimming resistor Rc 104 based on the 6-bit trim code. The clock trimming resistor Rc 104 includes forty-one resistance units connected in series, each resistance unit associated with a switch and has a resistance of R. If switch t0 is enabled, the resistance of the clock trimming resistor Rc 104 is R. If switch t1 is enabled, the resistance of the clock trimming resistor Rc 104 is 2R. If switch t2 is enabled, the resistance of the clock trimming resistor Rc 104 is 3R. If all the switches are turned off, the resistance of the clock trimming resistor Rc 104 is 42R. The resistance of the clock trimming resistor Rc 104 can be adjusted from R to 42R.

If the resistors in the clock trimming resistor Rc 104 are n-type diffusion resistors of the dimensions L/W/M=10.8u/0.3u/2 and the switches are PMOS transistors, the PMOS transistors have to be as large as W/L/M=11u/0.4u/4 to minimize the parasitic effect of the switches. M stands for the number of the same semiconductor devices (i.e., resistors or transistors) connected in parallel. W and L stand for the width and length of the semiconductor devices, respectively. Therefore, the clock trimming resistor Rc 104, in this example with 42 resistors, requires a total area of 13,974 $\mu m^2$. The n-type diffusion resistor occupies only 10% of the total area, but the rest 90% is occupied by the switches and the decoders. In other words, to adjust the resistance of the clock trimming resistor Rc 104 in FIG. 1B solely by enabling switches, the area penalty of the switches and decoders is 9 times that of resistors. Therefore, the clock trimming resistor Rc 104 in FIG. 1B is not area-efficient in terms of resistor usage.

Another drawback of the clock trimming resistor Rc 104 in FIG. 1B is that the applicable clock tuning range might become smaller due to resistance variations in the resistors. For example, the clock trimming resistor Rc 104 may have +/−15% resistance variation due to variation in fabrication processes. FIG. 1C illustrates the clock period of the clock circuit 100 in FIG. 1A in two corner cases. RES_FAST (−15% decrease from typical resistance in all resistance units) and RES_SLOW (+15% increase from typical resistance in all resistance units) represent the fast corner and the slow corner of the fabrication process respectively. The overlap of tuning range is from 88.1 ns to 92.9 ns, or 4.8 ns which is about 17% (=4.8 ns/27 ns) of the whole range for the RES_FAST corner case. In other words, the applicable tuning range is restricted due to resistance variation.

Therefore, it is desirable to provide a clock circuit technology addressing one or more of the above-mentioned limitations, such as more area-efficient clock circuits with a wider or more precise clock period tuning range.

SUMMARY

A clock circuit with first tuning circuitry and second tuning circuitry is described herein, which can provide more precise tuning and a greater tuning range and, in addition, a reduced area circuit. The clock circuit comprises an oscillator including an RC network that produces clock output signals that can be used as a frequency reference on an integrated circuit. The clock period of the clock output signals can be adjusted to some desired target clock period using parameters. The parameters can be stored parameters. The parameters can be static parameters, where a static parameter for the purposes of this description is an unchanging parameter during a time in which the clock signal is intended to maintain a constant or substantially constant period or frequency, and can be set, for example, during calibration procedures or other operations to set a desired clock period.

Coupled with the first tuning circuitry and the second tuning circuitry, an oscillator described herein comprises a first capacitor, a second capacitor, a first node operatively coupled to the first capacitor having a voltage that is a function of charge on the first capacitor, a second node operatively coupled to the second capacitor having a voltage that is a function of charge on the second capacitor, and a switching circuit having voltages of the first node and the second node as signal inputs and configured to alternately charge and discharge the first capacitor and the second capacitor and produce the clock output signals.

In some embodiments, the first tuning circuitry includes an adjustable resistance that is adjustable with a first resistance tuning step (e.g., a coarser resistance tuning step) based on a first parameter. The second tuning circuitry includes an adjustable resistance that is adjustable with a second resistance tuning step (e.g., a finer resistance tuning step) based on a second parameter. The clock period of the clock output signals is dependent upon the adjustable resistance of the first tuning circuitry and the adjustable resistance of the second tuning circuitry.

In some embodiments, the first tuning circuitry is connected in series with the second tuning circuitry. The first tuning circuitry comprises a plurality of first resistance units connected in series, first switches, and a first decoder. The first resistance units in the plurality of first resistance units are selectable by the first switches responsive to signals generated by the first decoder based on the first parameter. The second tuning circuitry comprises a plurality of second resistance units connected in series, second switches, and a second decoder. Second resistance units in the plurality of second resistance units are selectable by the second switches responsive to signals generated by the second decoder based on the second parameter. The first resistance units in the plurality of first resistance units have a higher resistance than second resistance units in the plurality of second resistance units.

In some embodiments, the switching circuit comprises comparators that compare the voltages of the first node and the second node with a reference voltage and produce comparison signals, logic circuits that generate the clock output signals in response to the comparison signals, and switches that are responsive to the clock output signals and enable alternate charging and discharging of the first capacitor and the second capacitor.

In some embodiments, the reference voltage is dependent upon the adjustable resistance of the first tuning circuitry. In some embodiments the reference voltage is dependent on a combination of the adjustable resistance of the first tuning circuitry and the adjustable resistance of the second tuning circuitry. The clock period is a function of rates of charging and discharging of the first capacitor and the second capacitor, and of the range of the voltage swing of the voltages on the first capacitor and second capacitor. One or more of the rates of charging and discharging and the range of the voltage swing are dependent upon the reference voltage in some embodiments.

Another clock circuit with first tuning circuitry and second tuning circuitry is described herein. The clock circuit comprises a first capacitor, a second capacitor, a first node operatively coupled to the first capacitor having a voltage that is a function of charge on the first capacitor, a second node operatively coupled to the second capacitor having a voltage that is a function of charge on the second capacitor and a switching circuit, having voltages of the first node and the second node as signal inputs, and configured to alternately charge and discharge the first capacitor and the second capacitor and produce the clock output signals. The first tuning circuitry can have an adjustable resistance that is adjustable with a coarser resistance tuning step based on a first parameter. The second tuning circuitry adjusts the charging and discharging currents of the first capacitor and the second capacitor based on a second parameter. The clock period of the clock output signals is dependent upon the adjustable resistance of the first tuning circuitry and the adjusted charging and discharging currents of the first capacitor and the second capacitor adjusted by the second tuning circuitry.

The first tuning circuitry comprises a plurality of first resistance units connected in series, first switches and a first decoder. First resistance units in the plurality of first resistance units are selectable by the first switches responsive to signals generated by the first decoder based on the first parameter. The second tuning circuitry comprises a plurality of current mirror units, second switches and a second decoder. Current mirror units in the plurality of current mirror units are selectable by the second switches responsive to signals generated by the second decoder based on the second parameter. By adjusting the magnitude of current provided by the current mirror units, the rate of discharging, or the rate of charging, of the capacitors can be tuned, thereby adjusting the clock period. One current mirror unit in the plurality of current mirror units is connected to the first capacitor, and another current mirror unit in the plurality of current mirror units is connected to the second capacitor.

Another clock circuit with first tuning circuitry and second tuning circuitry is described herein. The clock circuit comprises a first capacitor, a second capacitor, a first node operatively coupled to the first capacitor having a voltage that is a function of charge on the first capacitor, a second node operatively coupled to the second capacitor having a voltage that is a function of charge on the second capacitor and a switching circuit having voltages of the first node and the second node as signal inputs and configured to alternately charge and discharge the first capacitor and the second capacitor and produce the clock output signals. The first tuning circuitry is configured to adjust the clock period with a first period tuning step based on a first parameter. The second tuning circuitry is configured to adjust the clock period with a second period tuning step based on a second parameter where the second period tuning step is different than the first period tuning step. For example, the second period tuning step can be a finer period tuning step than the first period tuning step.

Another clock circuit with first tuning circuitry, second tuning circuitry and third tuning circuitry is described herein. The first tuning circuitry includes an adjustable resistance that is adjustable with a first resistance tuning step (e.g., a coarser resistance tuning step) based on a first parameter. The second tuning circuitry includes an adjustable resistance that is adjustable with a second resistance tuning step (e.g., a finer resistance tuning step) based on a second parameter. The third tuning circuitry adjusts charging and discharging currents of the first capacitor and the second capacitor based on a third parameter. The clock period of the clock output signals is dependent upon the adjustable resistance of the first tuning circuitry, the adjustable resistance of the second tuning circuitry and the adjusted charging and discharging currents of the first capacitor and the second capacitor adjusted by the third tuning circuitry.

Other aspects and advantages of the technology described herein can be seen on review of the drawings, the detailed description, and the claims, which follow.

BRIEF DESCRIPTION OF THE DRAWINGS

FIG. 7 illustrates a table of adjustable resistances for the clock circuit in FIG. 5.

DETAILED DESCRIPTION

A detailed description of embodiments of the technology is provided with reference to the FIGS. 2-9.

Figure 2:
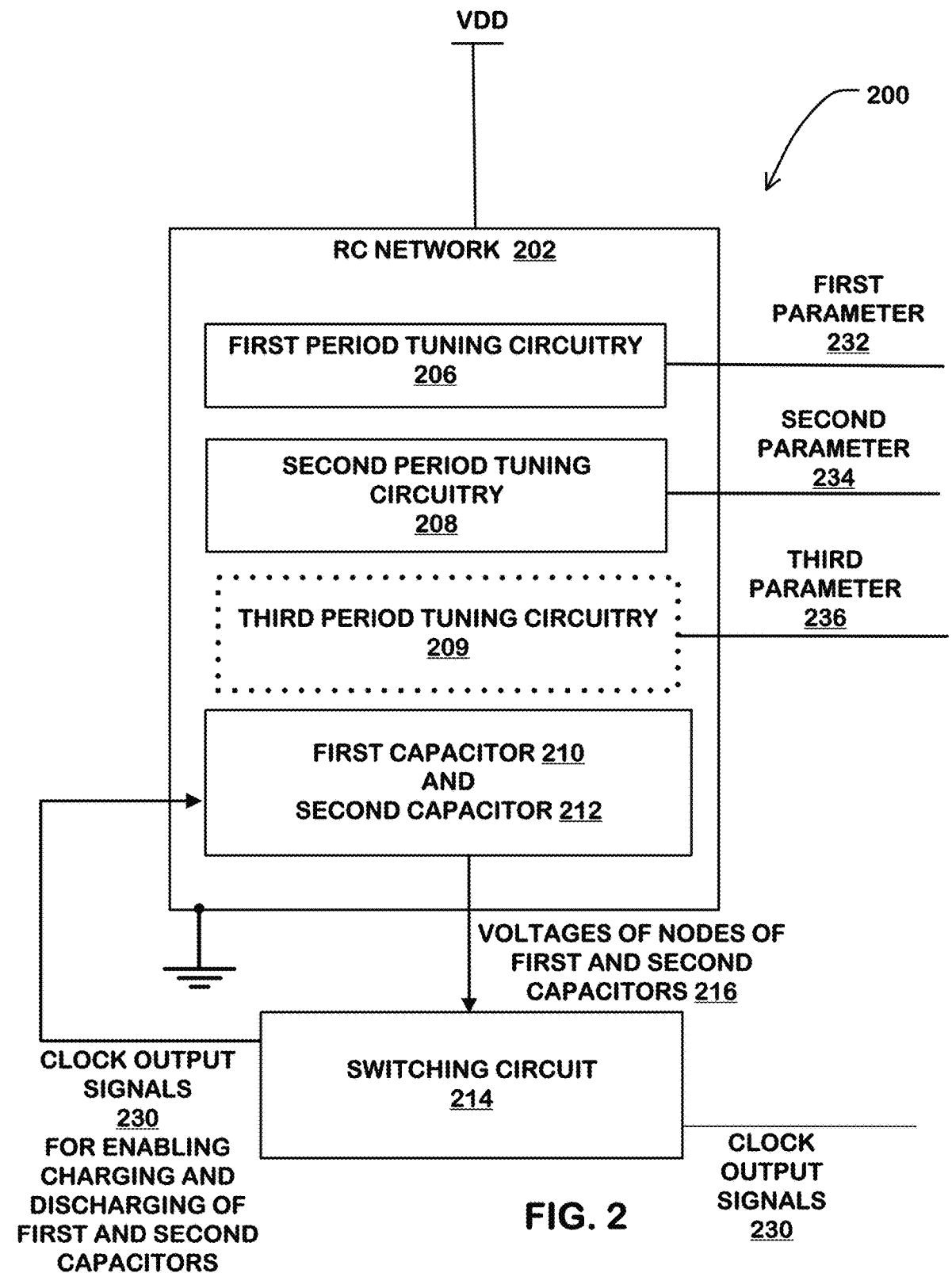
FIG. 2 illustrates a clock circuit with first tuning circuitry and second tuning circuitry.

FIG. 2 is a simplified diagram of clock circuit 200 with first tuning circuitry and second tuning circuitry generating clock output signals 230. The clock circuit 200 includes an RC network 202 including a first capacitor 210 and a second capacitor 212. The RC network 202 also includes first tuning circuitry 206 and second tuning circuitry 208. The RC network 202 may also include a third tuning circuitry 209.

The clock circuit 200 further includes a switching circuit 214 that produces the clock output signals 230. The switching circuit is configured to charge and discharge the first capacitor 210 and the second capacitor 212, alternately, through the clock output signals 230 generated by the switching circuit 214 based on the voltages at the terminal nodes of the first and second capacitors 216.

The clock period of the clock output signals can be adjusted at some desired target clock period by providing a first parameter 232, to the first tuning circuitry 206, and a second parameter 234 to the second tuning circuitry 208. In embodiments with the third tuning circuitry 209, a third parameter 236 is provided to the third tuning circuitry 209. A parameter can be used to set a static resistance in a tuning circuitry (i.e., the resistance of the tuning circuitry is static during operation of the clock circuits) or adjust current mirror ratio in the RC network 202 (i.e., the current mirror ratio is static during operation of the clock circuits). The parameters can be stored in volatile or nonvolatile memory on the same integrated circuit as the clock circuit. The first, second and third parameters can be static parameters.

The first tuning circuitry 206 is configured to adjust the clock period of the clock output signals 230 with a first period tuning step size. The first tuning circuitry 206 may have a configurable resistance based on the first parameter (e.g., a parameter used to set a resistance in the first trimming resistor).

The second tuning circuitry 208 is configured to adjust the clock period with a second period tuning step size. In one embodiment, the second tuning circuitry 208 may have a configurable resistance based on a second parameter 234 (e.g., a parameter used to set a resistance in the second trimming resistor). The adjustable resistances of the first tuning circuitry and the second tuning circuitry control the rates of charging and discharging of the first capacitor 210 and the second capacitor 212.

In another embodiment, the second tuning circuitry 208 may also reduce charging and discharging currents of the first capacitor and the second capacitor based the second parameter 234. The clock period of the clock output signals is dependent upon the adjustable resistance of the first tuning circuitry and the adjusted charging and discharging currents of the first capacitor and the second capacitor adjusted by the second tuning circuitry.

In the clock circuit 200, the responsibility of adjusting the clock period of the clock output signals 230 is shared by the first tuning circuitry 206 and the second tuning circuitry 208. The first tuning circuitry 206 is configured to adjust the clock period with a first period tuning step size and the second tuning circuitry 208 is configured adjust the clock period with a second period tuning step size. The second period tuning step size may be different than the first period tuning step size. For example, the first tuning circuitry 206 can have a coarser resistance tuning step and the second tuning circuitry 208 can have a finer resistance tuning step. For example, the first tuning circuitry 206 can be configured to have a resistances selectable among R, 2R, 3R, 4R, etc. The second tuning circuitry 208 can be configured to have resistances selectable among 0R, 0.25R, 0.5R, and 0.75R. The second tuning circuitry 208 can be used to fine tune the clock period of the clock circuit 200 between two resistance states of the first tuning circuitry 206. For example, the first tuning circuitry 206 can be configured to have a resistance of 2R and the second tuning circuitry 208 can be configured to have a negligible resistance or a resistance of 0.25R, 0.5R and 0.75R. Therefore, the effective resistance of the RC network 202 can be tuned using selected resistances of 2R, 2.25R, 2.75R, respectively. In order to achieve a selected resistance of 4.5R, the first tuning circuitry 206 can be configured to have a resistance of 4R and the second tuning circuitry 208 can be configured to have a resistance on 0.5R.

Figure 1A:
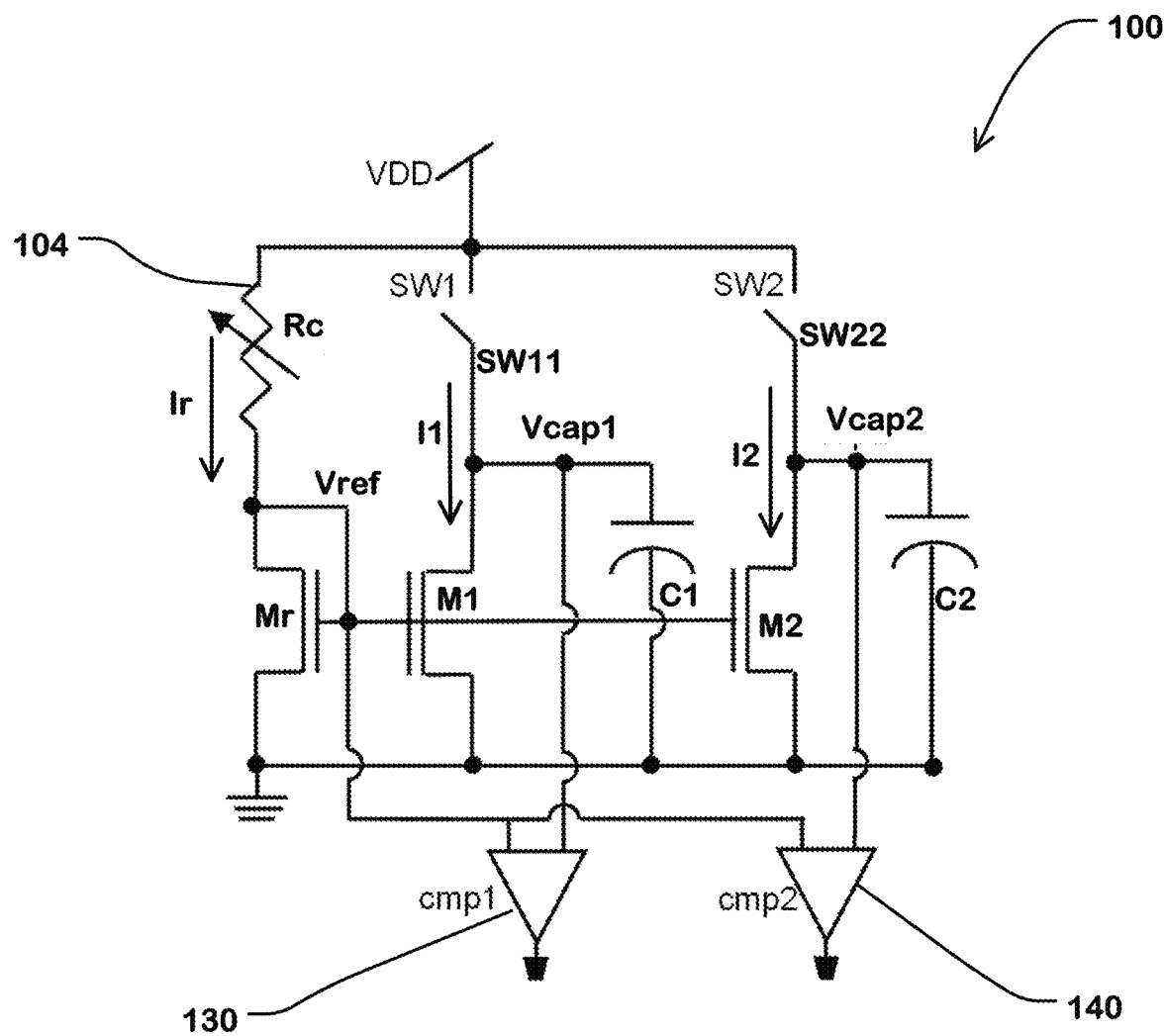
FIGS. 1A, 1B, and 1C illustrate a prior art model for a clock circuit.
Figure 1A:
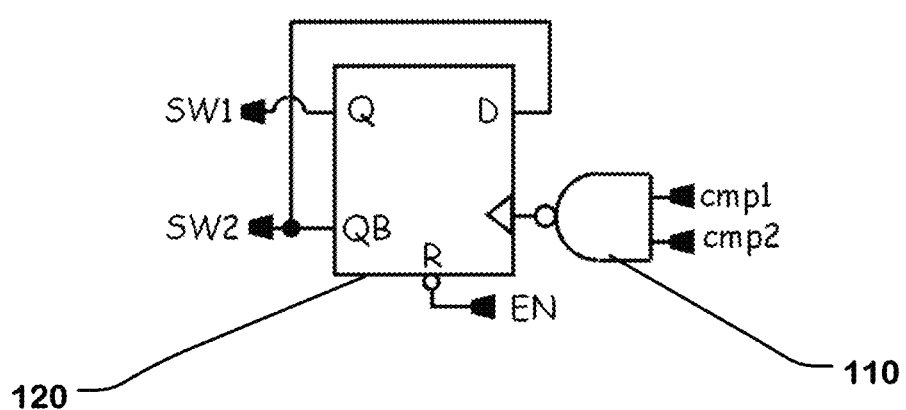
Figure 1B:
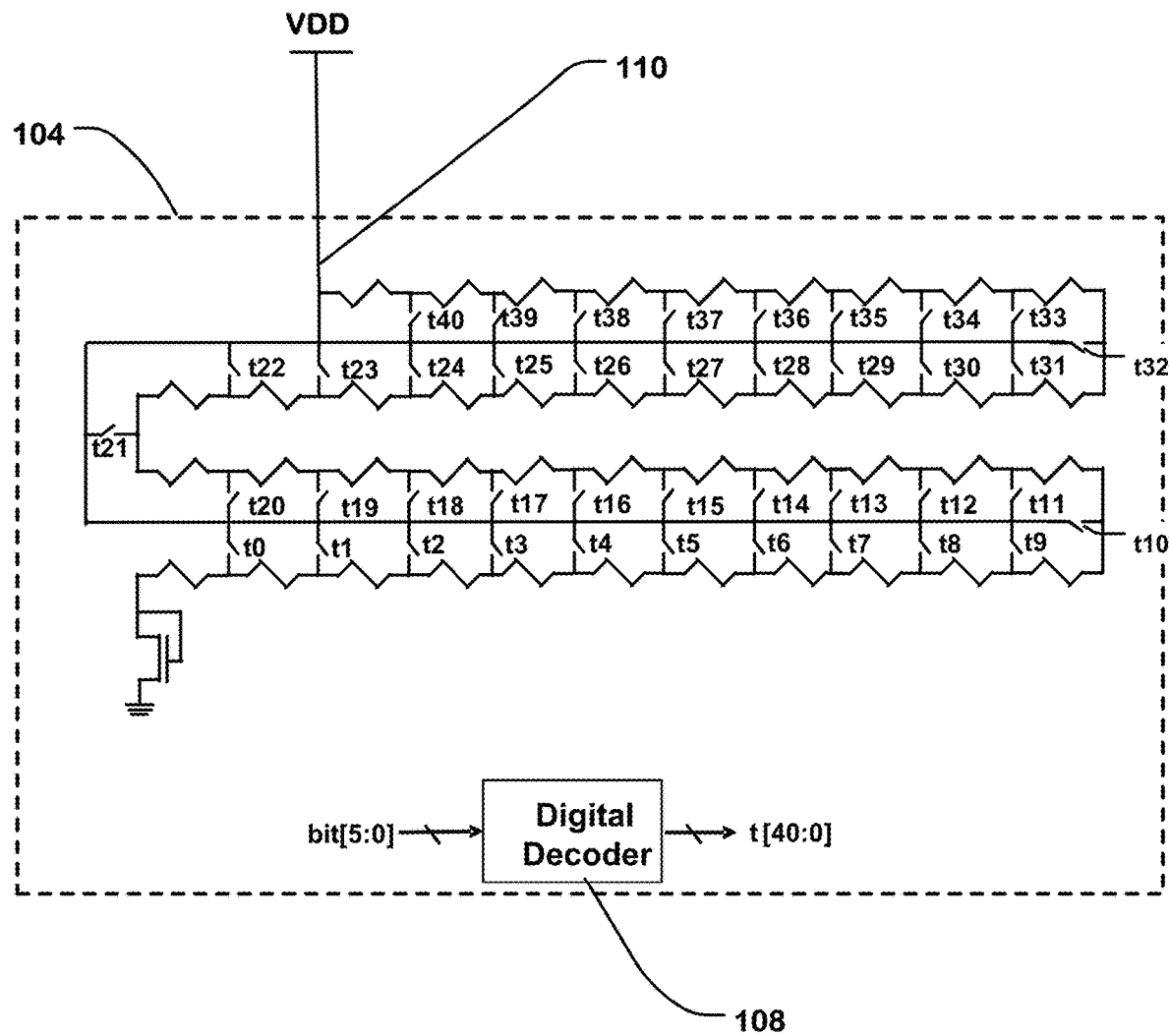
Figure 1C:
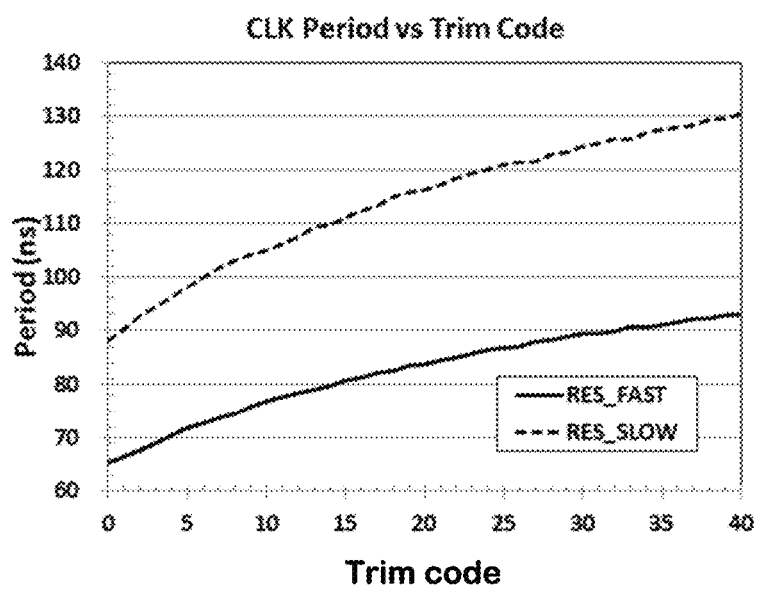

Dividing the responsibility of adjusting the clock period of the clock output signals 230 of the clock circuit 200 results in smaller tuning circuitry than the clock trimming resistor Rc 104 in FIG. 1B. Therefore, the technology described herein can provide a more area-efficient clock circuit, and can provide in a wider range of clock periods for the clock circuit 200.

In some embodiments, the clock circuit 200 may include a third tuning circuitry 209 configured to adjust the clock period on the clock output signals 230 based on a third parameter 236, providing even greater range or precision in tuning the clock period.

Figure 3A:
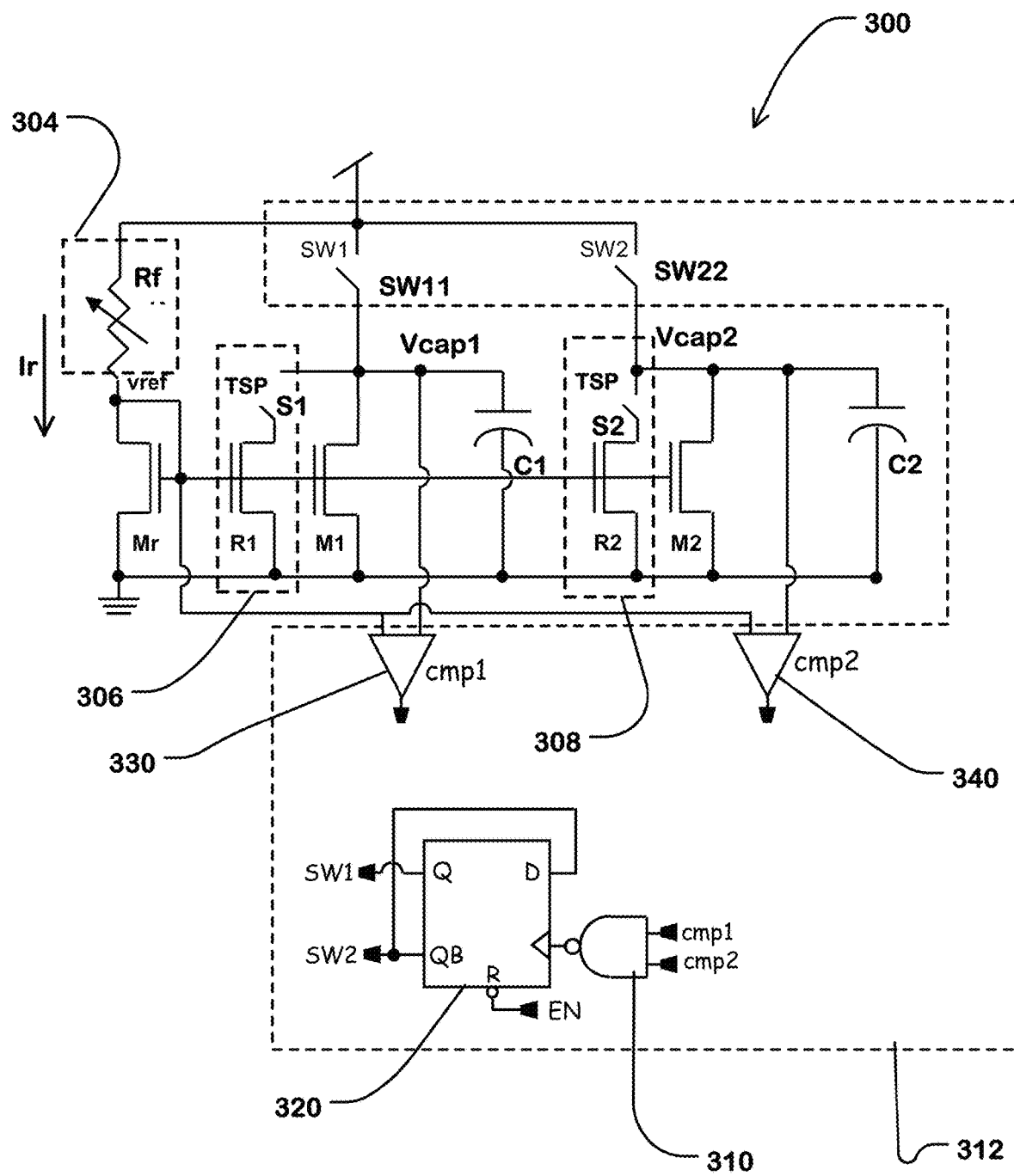
FIGS. 3A and 3B illustrate a schematic diagram of a first example of a clock circuit with first tuning circuitry and second tuning circuitry.
Figure 3A:
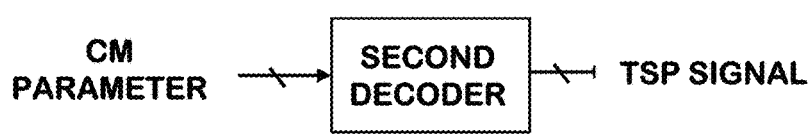

FIG. 3A illustrates a schematic diagram of a first example of a clock circuit 300 with first tuning circuitry and second tuning circuitry. The clock circuit 300 includes a first capacitor C1, a second capacitor C2, a first clock trimming resistor 304 as the first tuning circuitry, second tuning circuitry and a switching circuit 312. The first clock trimming resistor 304 acting as the first tuning circuitry controls a current Ir flowing through a transistor Mr. A node Vcap1 has a voltage that is a function of charge on the first capacitor C1. A node Vcap2 has a voltage that is a function of charge on the second capacitor C2.

The reference voltage Vref is a bias voltage of transistors M1, M2, and Mr. The reference voltage Vref is used to control the alternating charging and discharging of capacitors C1 and C2. Capacitors C1 and C2 can have the same or different capacitances.

The switching circuit 312 includes a pair of comparators 330 and 340, a NAND gate 310, a D flip-flop 320, and two switches SW11 and SW22. The comparator 330 compares the voltage at the node Vcap1 of the capacitor C1 with the reference voltage Vref and generates a signal cmp1, accordingly which is then sent to the NAND gate 310. For example, if the voltage at the node Vcap1 is higher than the reference voltage Vref, the signal cmp1 is at a high level. Otherwise, the signal cmp1 is at a low level. The comparator 340 compares the voltage at the node Vcap2 of the capacitor C2 with the reference voltage Vref and generates a signal cmp2 which is then sent to the NAND gate 310. For example, if the voltage at the node Vcap2 is higher than the reference voltage Vref, the signal cmp2 is at a high level. Otherwise, the signal cmp2 is at a low level. The signal SW1 and SW2 output from the D flip-flop 120 are used to enable or disable switch SW11 and SW22 respectively.

Figure 3B:
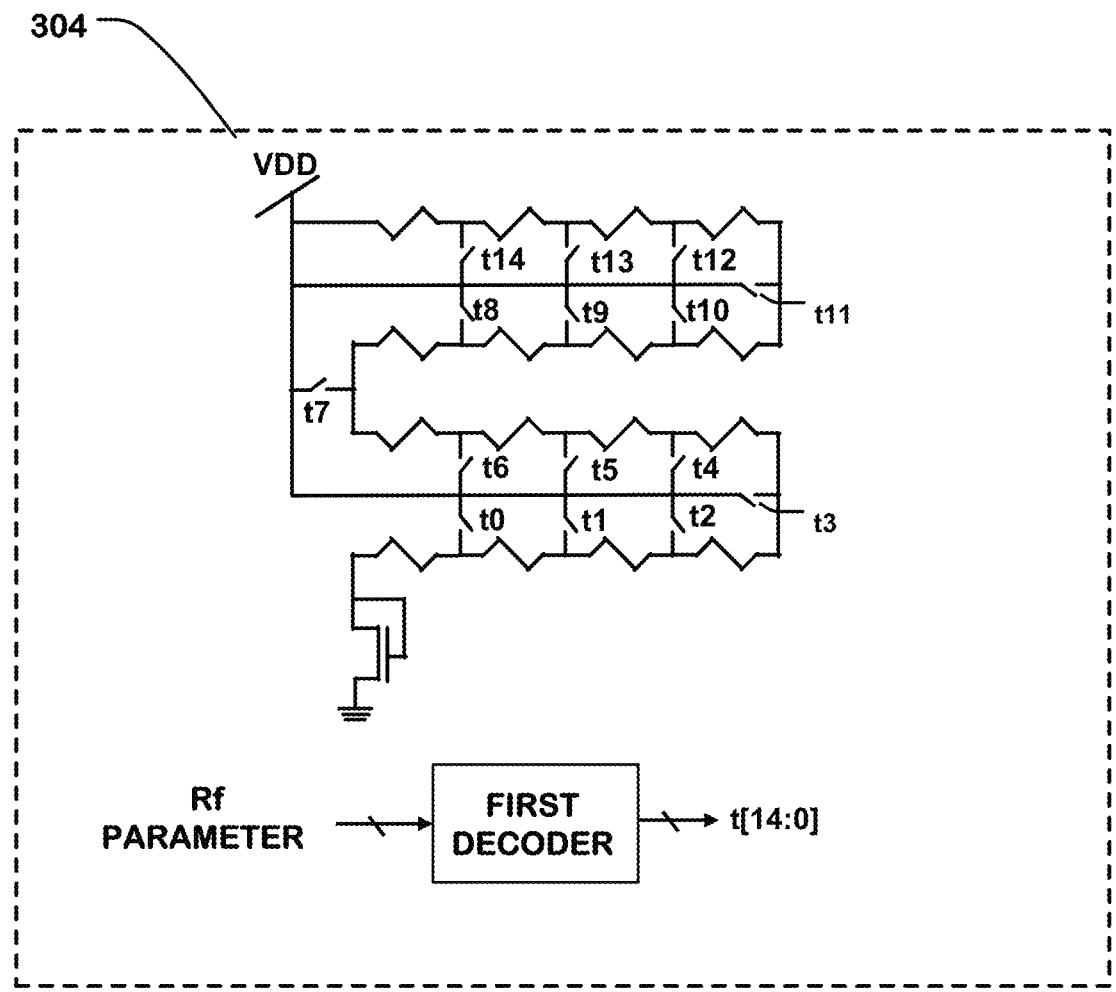

FIG. 3B illustrates an example of the first clock trimming resistor 304 with an adjustable resistance Rf. The resistance of the first clock trimming resistor 304 is adjusted by a trim code. The first clock trimming resistor 304 includes fifteen tunable switches selectable by a 4-bit first parameter. A first decoder generates signals to enable switches in the first clock trimming resistor 304 based on the 4-bit first parameter. The first clock trimming resistor 304 includes fifteen resistance units connected in series, each resistance unit associated with a switch and has a resistance of R. If switch t0 is enabled, the resistance Rf of the first clock trimming resistor 304 is R. If switch t1 is enabled, the resistance Rf of the first clock trimming resistor 304 is 2R. If all the switches are turned off, the resistance Rf of the first clock trimming resistor 304 is 16R. The resistance Rf of the first clock trimming resistor 304 can be adjusted from R to 16R.

In some embodiments, the resistance units may comprise n-type resistors and PMOS transistors as switches. If for example the n-type diffusion resistors have the dimensions L/W/M=10.8u/0.3u/2 and the PMOS transistor acting as switches have the dimensions W/L/M=11u/0.4u/4, the first clock trimming resistor 304 requires a total area of 5200 μm2. Therefore, the first clock trimming resistor 304 is much smaller and area-efficient than the clock trimming resistor Rc 104 in FIG. 1B.

Referring to FIG. 3A, the second tuning circuitry in the clock circuit 300 include two current mirror units 306 and 308. A current mirror unit adjusts the charge and discharge currents of the first capacitor C1 and the second capacitor C2. The current mirror unit 306 is connected in parallel between ground and the node Vcap1 of the first capacitor C1. The current mirror unit 306 includes a first NMOS transistor R1 and a first switch S1. The current mirror unit 308 is connected in parallel between ground and the node Vcap2 of the second capacitor C2. The current mirror unit 308 includes a second NMOS transistor R2 and a second switch S2. The reference voltage Vref is a bias voltage of the first NMOS transistor R1 in the current mirror unit 306 and the NMOS transistor R2 in the current mirror unit 308. A current mirror unit may include a number of electronic devices, such as an NMOS transistor, a PMOS transistor, a field-effect transistor, a floating gate transistor, etc.

The current mirror units 306 and 308 adjust the charge and discharge currents of the first capacitor C1 and the second capacitor C2 by adjusting the current mirror ratio between the currents I1, I2, and Ir in response to a current mirror CM parameter (See, FIG. 3A). For example, the NMOS transistor Mr can have a dimension M of 6 (i.e., six NMOS transistors connected in parallel), the NMOS transistors M1 and M2 can have a dimension M of 5 (i.e., five NMOS transistors connected in parallel) and the first and second NMOS transistors R1 and R2 have a dimension M of 1 (i.e., one NMOS transistor). The first switch S1 and the second switch S2 in the current mirror units 306 and 308 are responsive to a signal TSP generated by a decoder based on the CM parameter, which can be a static parameter as indicated in the figure. If the signal TSP is enabled and the switches S1 and S2 are turned on, the current mirror ratio between the currents Ir and the currents I1 and I2 is equal 1 (i.e., Ir/I1=Ir/I2=6/6). Therefore, the clock period of the clock circuit 300 is determined by the resistance of the first clock trimming resistor 304. If the signal TSP is not enabled and the switches S1 and S2 are turned off, the current mirror ratio between the currents Ir and the currents I1 and I2 is greater 1 (i.e., Ir/I1=Ir/I2=6/5). The increased current mirror ratio results in decreased discharge currents I1 and I2 through capacitors C1 and C2 in this example, prolonging the discharge of the capacitors C1 and C2. In some embodiments, the current mirror units can adjust the current mirror ratio to be less than 1, so that enabling the switch increases the discharge rates. In the circuit of FIG. 3A, the clock period is a function of the range of the swing of the voltage Vcap1 and Vcap2, as set by Vref set by the parameter Rf, and by the magnitude of the current set by the current mirror units as controlled by Vref and the number of enabled current mirror units set by a CM parameter. In some embodiments, the current mirror units can be controlled by a bias voltage such as a band gap reference voltage, different than Vref, which can be tunable or fixed as suits a particular embodiment. Reducing the discharge current has the effect of prolonging the period for a given Vref, and can be considered equivalent to increasing Rf, to decrease Vref to increase the range of the swing of Vcap1 and Vcap2.

Figures 4A, 4B:
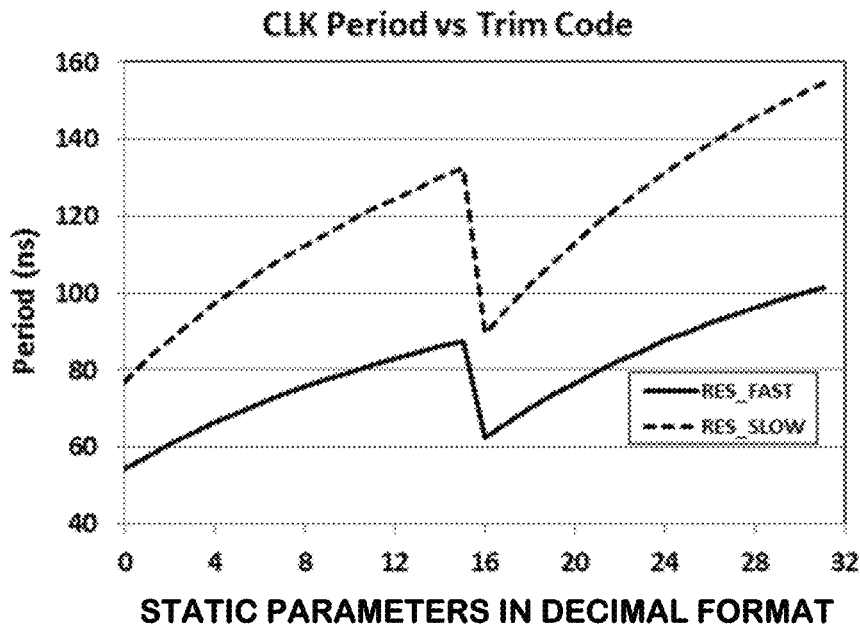
FIG. 4A illustrates a table of the adjustable resistance for the clock circuit in FIGS. 3A and 3B.
FIG. 4B is a relationship diagram illustrating the relationship between the clock period and the adjustable resistance of the first tuning circuitry and second tuning circuitry of the clock circuit in FIGS. 3A and 3B.

FIG. 4A illustrates a table of equivalent trim resistances for changes in clock period for the clock circuit 300 in FIG. 3A according to one example. When the CM parameter turns on switches S1 and S2 setting a 6:6 current mirror ratio, the equivalent trim resistance in the clock circuit is equal to the resistance Rf of the first clock trimming resistor 304. If switch t0 is enabled, the equivalent trim resistance is R. If switch t1 is enabled, the equivalent trim resistance is 2R. If all the switches are turned off, the equivalent trim resistance is 16R. When the CM parameter turns off switches S1 and S2, setting a 6:5 current mirror ratio, the magnitude of the charge and discharge current is reduced, and equivalent trim resistance increases by 20% of the resistance Rf of the first clock trimming resistor 304. If switch t0 is enabled, the equivalent trim resistance is 1.2R. If switch t1 is enabled, the equivalent trim resistance is 2.4R. If all the switches t0-t14 are turned off, and the CM parameter turns off switches S1 and S2, the equivalent trim resistance is 19.2R.

FIG. 4B is a relationship diagram illustrating the relationship between the clock period and the adjustable equivalent resistance of the first tuning circuitry and second tuning circuitry, for one example of the clock circuit 300 in FIG. 3A, at corner cases in a manufacturing setting RES_SLOW and RES_FAST. A 5-bit parameter is used to select the clock period, where the first bit specifies whether the switches S1 and S2 are on (conducting or closed) or off (not conducting or open). The last 4 bits of the 5-bit parameter are used to choose the resistance of the first clock trimming resistor 304. When switches S1 and S2 are on (5-bit parameter between 0 and 15), the tunable range of the clock period for the corner case RES_FAST is 33 ns (=86 ns-53 ns). When switches S1 and S2 are off (5-bit parameter between 16 and 31), the range of the clock period for the corner case RES_FAST is 39.2 ns (=101.5 ns-62.3 ns). In addition, the overall tuning range of the clock period for the corner case RES_FAST is 48.5 ns (=101.5 ns-53 ns). The overlap of tuning range (which corresponds to a safely specified tuning range for a product) between the corner case RES_FAST and the corner case RES_SLOW is between about 101 ns to about 75 ns, or 51% of the whole range for the RES_FAST case.

In an example implementation, the total area required to implement the tunable effective resistance features for the circuit of FIGS. 3A and 3B is about 5200.9 μm². As compared to the 13,974 μm² of the circuit in FIGS. 1A and 1B, a circuit area reduction of over 50% is achieved, while providing a substantially greater tunable range.

Figure 5:
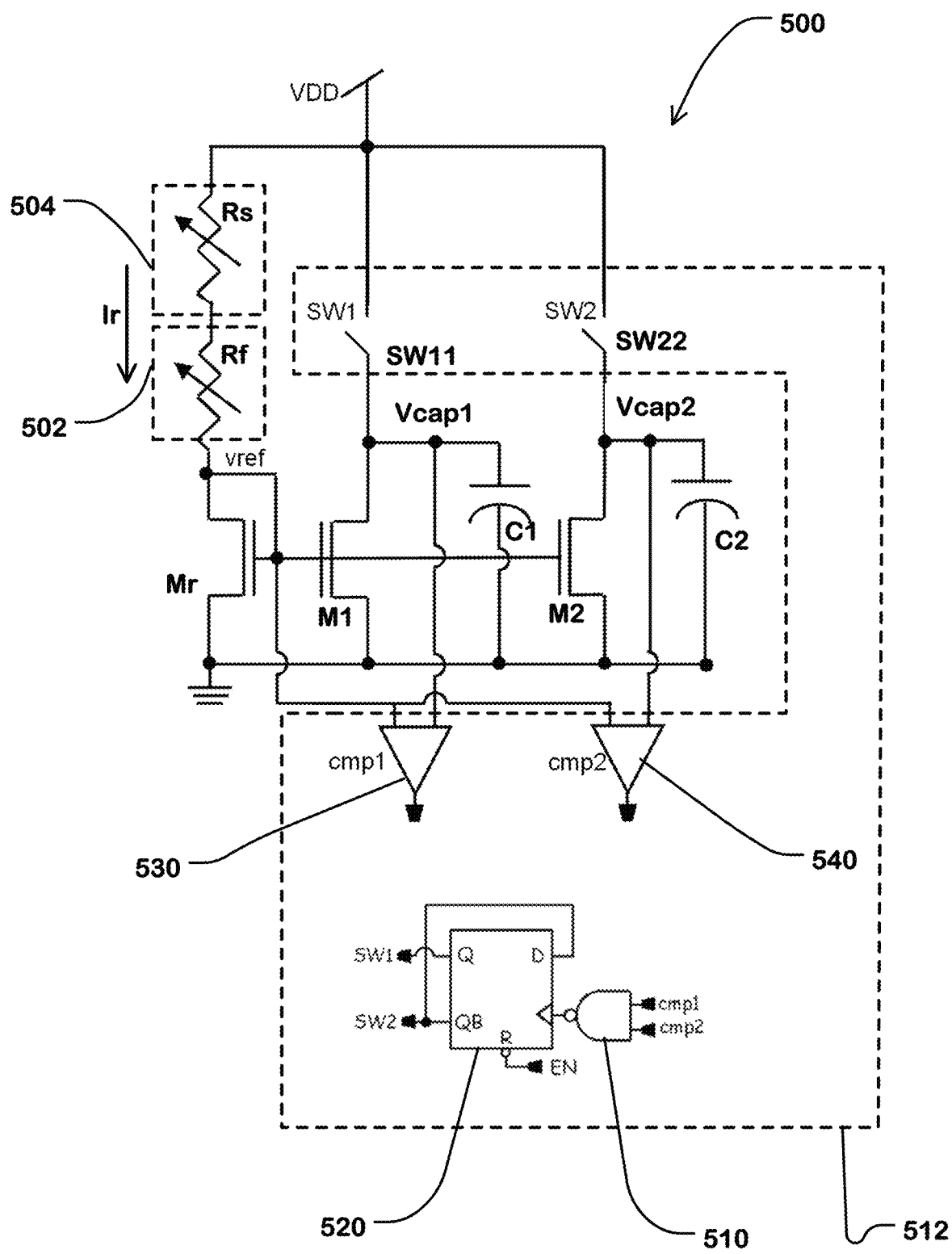
FIG. 5 illustrates a schematic diagram of a second example of a clock circuit with first tuning circuitry and second tuning circuitry.

FIG. 5 illustrates a schematic diagram of a second example of a clock circuit 500 with first tuning circuitry and second tuning circuitry. The clock circuit 500 includes an RC network comprising a first capacitor C1, a second capacitor C2, a first clock trimming resistor R1 502 acting as the first tuning circuitry, a second clock trimming resistor R2 504 acting as second tuning circuitry, and a switching circuit 512. The first clock trimming resistor R1 502 acting as the first tuning circuitry and the second clock trimming resistor R2 504 acting as second tuning circuitry are connected in series. The first clock trimming resistor R1 502 and the second clock trimming resistor R2 504 control a current Ir flowing through a transistor Mr, and establish the reference voltage Vref. The switching circuit 512 includes a pair of comparators 530 and 540, a NAND gate 510, a D flip-flop 520, and two switches SW11 and SW22.

The rates at which the first capacitor C1 and the second capacitor C2 charge and discharge are dependent on the trim resistance. The first clock trimming resistor R1 502 is configured to adjust the clock period with a coarser tuning step size and the second clock trimming resistor R2 504 is configured to adjust the clock period with a finer resistance tuning step size. The finer resistance tuning step size is smaller than the coarser resistance tuning step size. For example, the first clock trimming resistor can have a coarser tuning step size of resistance R and the second clock trimming resistor can have a finer tuning step size of resistance 0.25R. The equivalent trim resistance in the clock circuit 500 is a combination of the resistance Rf of the first clock trimming resistor and the resistance Rs of the second clock trimming resistor. The second clock trimming resistor R2 504 can be used to fine tune the clock period of the clock circuit 500 between two resistance states of the first clock trimming resistor R1 502. For example, the first clock trimming resistor R1 502 can be configured to have resistance Rf of 2R and the second clock trimming resistor can be configured to have a resistance Rs of 0.25r, 0.5r and 0.75r or a negligible resistance. Therefore, the equivalent trim resistance in the clock circuit 500 can be 2R, 2.25R, 2.75R. In order to achieve an equivalent trim resistance in the clock circuit 500 of 4.5R, the first clock trimming resistor can be configured to have a resistance Rf of 4R and the second clock trimming resistor R2 can be configured to have a resistance Rs of 0.5R.

Figure 6:
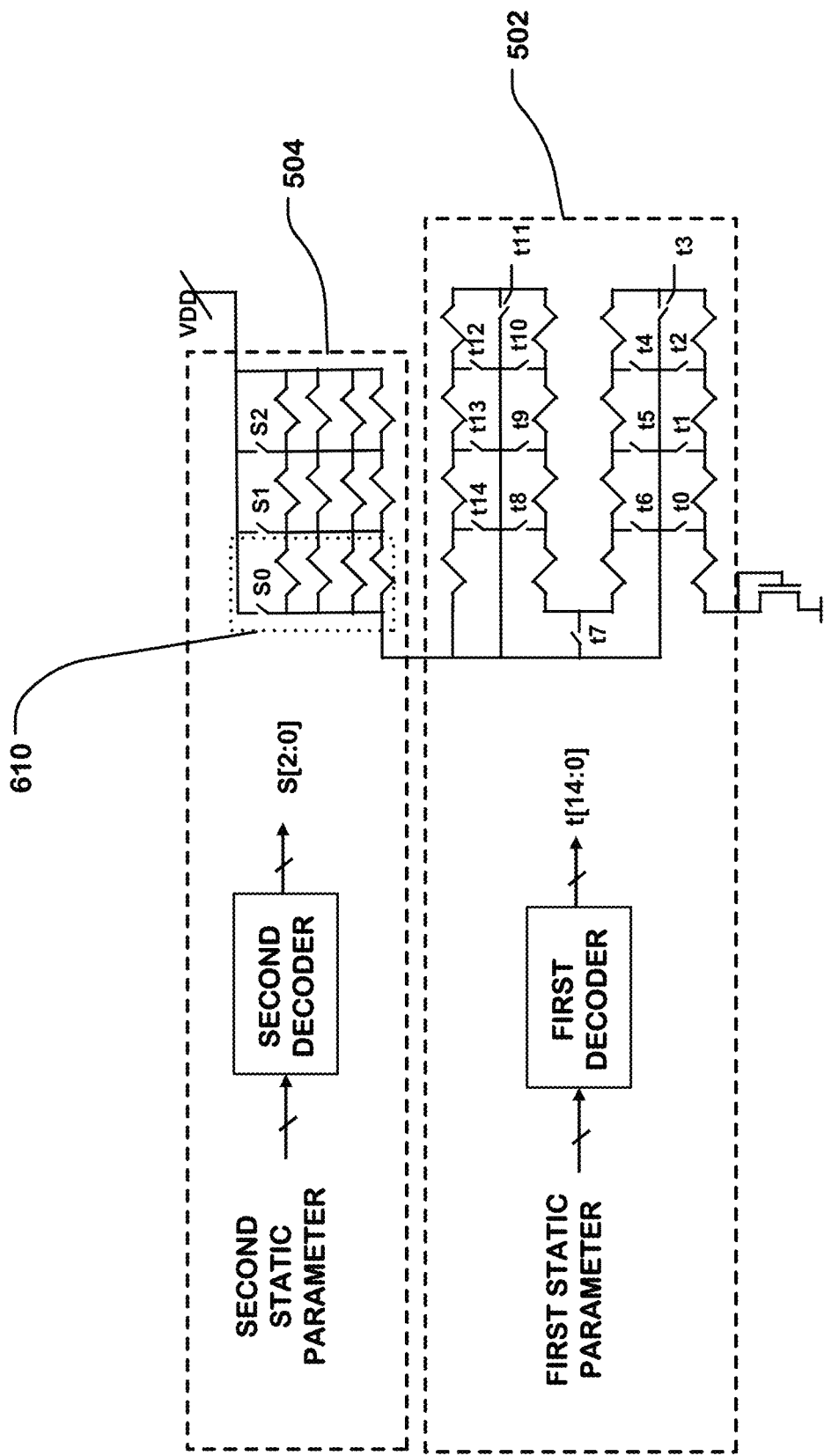
FIG. 6 illustrates examples of the first tuning circuitry and the second tuning circuitry of the clock circuit in FIG. 5.

FIG. 6 illustrates an example of the first clock trimming resistor R1 502 and the second clock trimming resistor R2 504. The resistance Rf of the first clock trimming resistor R1 502 is adjusted by a 4-bit first parameter. The first clock trimming resistor R1 502 includes fifteen tunable switches t0-t14 adjusted by the 4-bit first parameter. A first decoder generates signals to enable switches in the first clock trimming resistor R1 502 based on the 4-bit first parameter. The first clock trimming resistor R1 502 includes fifteen resistance units connected in series, each resistance unit associated with a switch, and has a resistance of R. If switch t0 is enabled, the resistance Rf of the first clock trimming resistor R1 502 is R. If switch t1 is enabled, the resistance Rf of the first clock trimming resistor R1 502 is 2R. If all the switches are turned off, the resistance Rf of first clock trimming resistor R1 502 is 16R. The resistance Rf of the first clock trimming resistor R1 502 can be adjusted from R to 16R.

The resistance Rs of the second clock trimming resistor R2 504 is also adjusted by a 2-bit second parameter. The second clock trimming resistor R2 504 includes three tunable switches S0-S2 adjusted by the 2-bit second parameter. A second decoder generates signals to enable switches in the second clock trimming resistor R2 504 based on the 2-bit second parameter. The second trimming resistor 504 includes three resistance units (e.g., resistive unit 610) connected in parallel, each resistance unit associated with a switch and has a resistance of 0.25R. If switch S0 is enabled, the resistance Rs of the second clock trimming resistor R2 504 is negligible. If switch s1 is enabled, the resistance Rs of the second clock trimming resistor R2 504 is 0.25R. If switch s2 is enabled, the resistance Rs of the second clock trimming resistor R2 504 is 0.5R. If all the switches are turned off, the resistance Rs of second clock trimming resistor R2 504 is 0.75R.

In some embodiments, the resistance units in the first clock trimming resistor R1 502 and the second clock trimming resistor R2 504 may comprise n-type resistors and PMOS transistors as switches. If the n-type diffusion resistors have the dimensions L/W/M=10.8u/0.3u/2 and the PMOS transistor acting as switches have the dimensions W/L/M=11u/0.4u/4, the first clock trimming resistor R1 502 and the second clock trimming resistor R2 504 require a total area of 8921 μm2 with 20% of the total area being occupied by the first and second decoders. Therefore, the combined size of first clock trimming resistor R1 502 and the second clock trimming resistor R2 504 is much smaller and area-efficient than the clock trimming resistor Rc 104 in FIG. 1B.

FIG. 7 illustrates a table of adjustable resistances for the clock circuit 500 in FIG. 5. The first clock trimming resistor can have a coarser tuning step size of resistance R and the second clock trimming resistor can have a finer tuning step size of resistance 0.25R. The equivalent trim resistance in the clock circuit 500 is a combination of the resistance Rf of the first clock trimming resistor and the resistance Rs of the second clock trimming resistor. The second clock trimming resistor can be used to fine tune the clock period of the clock circuit 500 between two resistance states of the first clock trimming resistor. In order to achieve a trim resistance of R, the t0 switch of the first clock trimming resistor and the s0 switch of the second trimming resistor are turned on. In order to achieve a trim resistance of 1.25R, the t0 switch of the first clock trimming resistor and the s1 switch of the second trimming resistor are turned on. In order to achieve a trim resistance of 1.5R, the t0 switch of the first clock trimming resistor and the s2 switch of the second trimming resistor are turned on. In order to achieve a trim resistance of 1.75R, only the t0 switch of the first clock trimming resistor is turned on. Similarly, in order to achieve a trim resistance of 2R, the t1 switch of the first clock trimming resistor and the s0 switch of the second trimming resistor are turned on. In order to achieve a trim resistance of 2.25R, the t1 switch of the first clock trimming resistor and the s1 switch of the second trimming resistor are turned on. In order to achieve a trim resistance of 2.5R, the t1 switch of the first clock trimming resistor and the s2 switch of the second trimming resistor are turned on. In order to achieve a trim resistance of 2.75R, only the t1 switch of the first clock trimming resistor is turned on.

Figure 8:
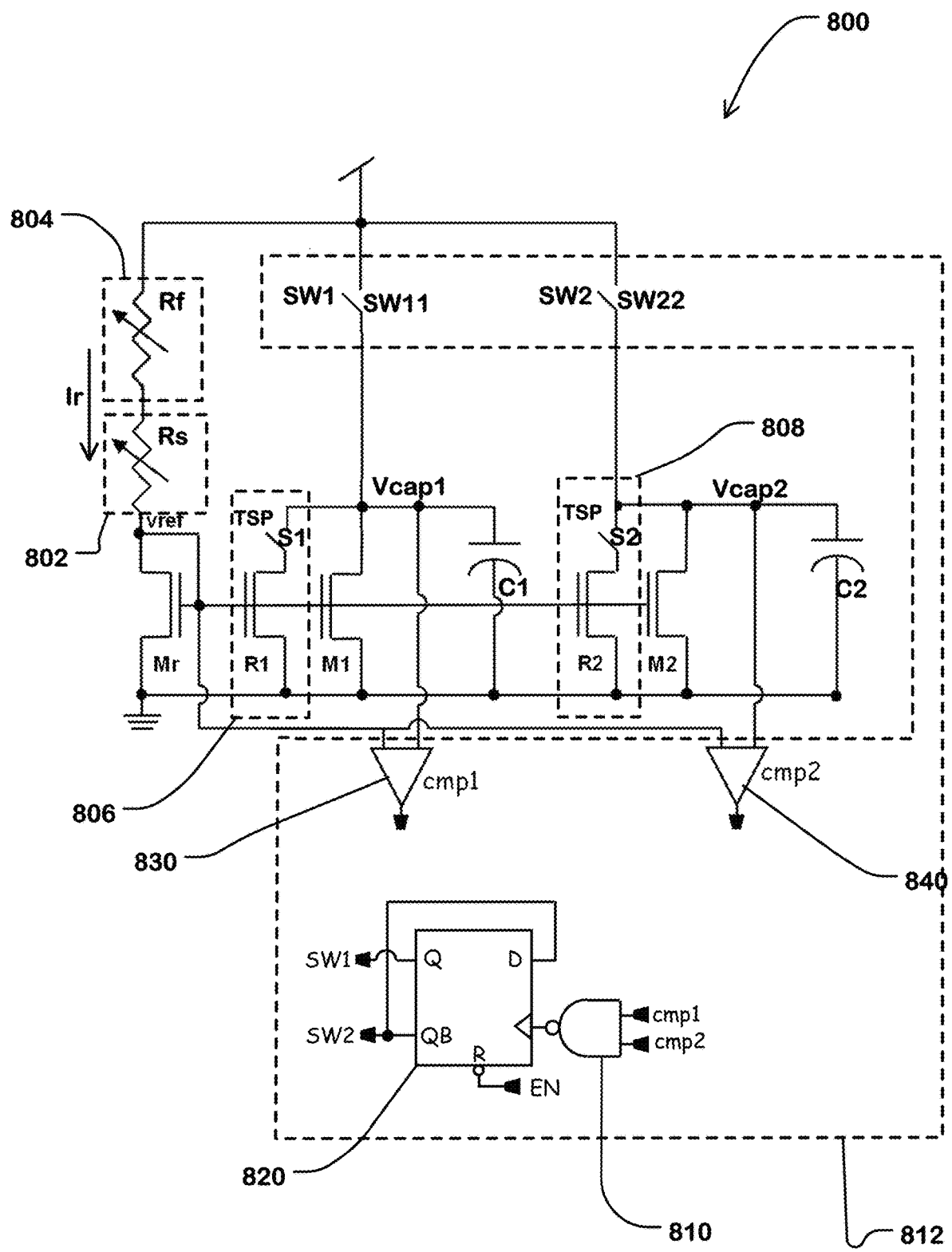
FIG. 8 illustrates a schematic diagram of an example of a clock circuit with first tuning circuitry, second tuning circuitry and third tuning circuitry.

FIG. 8 illustrates a schematic diagram of an example of a clock circuit 800 with first tuning circuitry, second tuning circuitry and third tuning circuitry. The RC network of clock circuit 800 includes a first capacitor C1, a second capacitor C2, a first clock trimming resistor 802 acting as the first tuning circuitry, a second clock trimming resistor 804 acting as second tuning circuitry, and a switching circuit 812. The first clock trimming resistor 802 acting as the first tuning circuitry and the second clock trimming resistor 804 acting as second tuning circuitry are connected in series. The first clock trimming resistor 802 and the second clock trimming resistor 804 control a current Ir flowing through a transistor Mr. The switching circuit 512 includes a pair of comparators 830 and 840, a NAND gate 810, a D flip-flop 820, and two switches SW11 and SW22.

The third tuning circuitry includes two current mirror units 806 and 808. The current mirror unit 806 is connected in parallel to the first capacitor C1. The current mirror unit 806 includes a first NMOS transistor R1 and a first switch S1. The current mirror unit 808 is connected in parallel to the second capacitor C2. The current mirror unit 808 includes a second NMOS transistor R2 and a second switch S2. The reference voltage Vref is a bias voltage of the first NMOS transistor R1 in the current mirror unit 806 and the NMOS transistor R2 in the current mirror unit 808. The current units 806 and 808 adjust the charge and discharge currents of the first capacitor C1 and the second capacitor C2 by adjusting the current mirror ratio between the currents I1, I2, and Ir in response to the reference voltage Vref.

The rate at which the first capacitor C1 and the second capacitor C2 charge and discharge are dependent on Vref as set by the resistance Rs+Rf of the clock circuit 800 and the adjusted discharge current through the capacitors as set by the state of switches S1 and S2. The first clock trimming resistor 802 is configured to adjust the clock period with a coarser resistance tuning step size and the second clock trimming resistor 804 is configured to adjust the clock period with a finer resistance tuning step size. The finer resistance tuning step size is smaller than the coarser resistance tuning step size.

Figure 9:
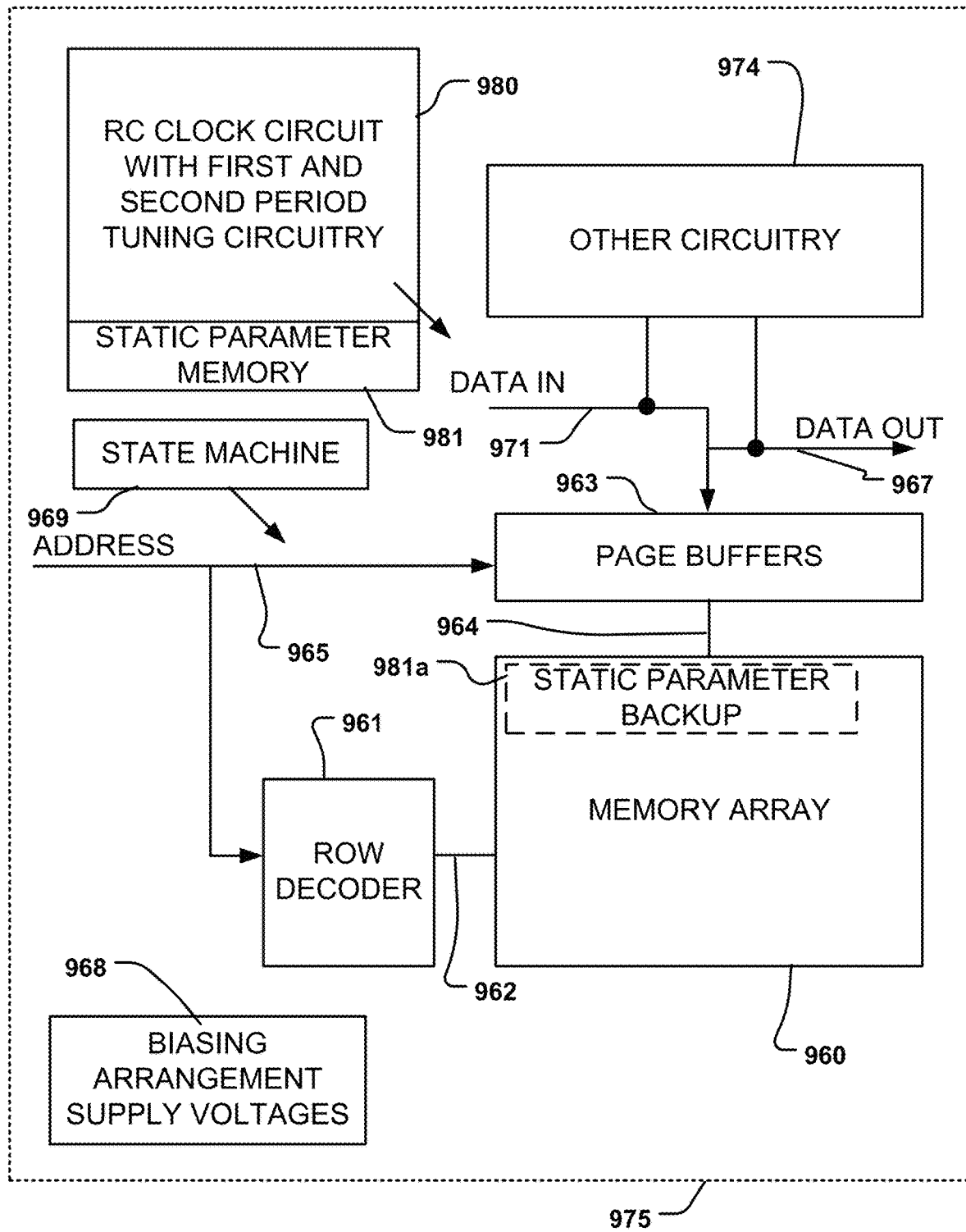
FIG. 9 is a block diagram of an integrated circuit including a clock circuit with first tuning circuitry and second tuning circuitry, as described herein.

FIG. 9 is a simplified chip block diagram of an integrated circuit 975 including a clock circuit 980 (such as an RC oscillator) with first tuning circuitry and second tuning circuitry. This example integrated circuit 975 includes a memory array 960 on an integrated circuit substrate with the clock circuit 980. A nonvolatile parameter memory 981 on the chip stores the parameters for adjusting the period of the clock signal, as described above. The parameter memory 981 can also be implemented as part of the array 960 in other embodiments. In some embodiments, backup copies, including two or several copies of the first and second parameters, can be encoded and stored within different blocks (e.g., 981a or the same blocks of the same nonvolatile memory to protect the first and second parameters, in case that one copy has failed bits, and other copies could still be utilized. In some embodiments, the clock circuit has a disabled status which can be set by a control signal. In the disabled status, the output signal is not oscillating and the internal signals can be set at zero or at an internal regulated voltage level. The power consumption of a disabled clock circuit can be relatively small compared with an enabled clock circuit.

In the illustrated memory chip, a row decoder 961 is coupled to a plurality of word lines 962 and arranged along rows in the memory array 960. A page buffer 963 in this example is coupled to a plurality of bit lines 964 arranged along columns in the memory array 960 for reading data from and writing data to the memory array 960. Addresses are supplied on bus 965 to page buffer 963 and row decoder 961. The page buffers 963 are coupled to data-in circuits and data-out circuits via lines 971 and 967.

Other circuitry 974 can be included on the chip to support mission functions, to provide system-on-a-chip SOC functionality and so on. Control logic 969, including a state machine, for example, or other control circuits controls the application of supply voltages generated or provided through the voltage supply or supplies in block 968, such as read, verify and program voltages.

The control logic (block 974) can be implemented using special purpose logic circuitry as known in the art. In alternative embodiments, the control logic comprises a general purpose processor, which can be implemented on the same integrated circuit, which executes a computer program to control the operations of the device. In yet other embodiments, a combination of special purpose logic circuitry and a general purpose processor can be utilized for implementation of the control logic.

The clock output signal is utilized as a clock signal by on-chip circuitry, including one or more of control logic, all or part of the other circuitry, and the page buffers. In some embodiments, the clock circuit can be an RC relaxation oscillator without the need for an off-chip reference clock. In other embodiments, the clock circuit 980 can comprise a frequency locked loop, a phase locked loop or a delay locked loop.

For the purposes of this description, a value, such a voltage, resistance or current, can be considered to be based on a parameter, if it is determined at least in part by a circuit responsive to the parameter. The parameter can be a stored parameter. The parameter can be a static parameter.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A clock circuit that produces clock output signals with a clock period, comprising:
   a first capacitor and a second capacitor;
   a first node operatively coupled to the first capacitor having a voltage that is a function of charge on the first capacitor and a second node operatively coupled to the second capacitor having a voltage that is a function of charge on the second capacitor;
   a switching circuit having voltages of the first node and the second node as signal inputs and configured to alternately charge and discharge the first capacitor and the second capacitor and produce the clock output signals;
   first tuning circuitry configured to adjust the clock period with a first period tuning step based on a first parameter; and
   second tuning circuitry configured to adjust the clock period with a second period tuning step based on a second parameter, the second period tuning step being different than the first period tuning step.

2. The clock circuit of claim 1, wherein the switching circuit comprises:
   comparators comparing the voltages of the first node and the second node with a reference voltage and producing comparison signals;
   logic circuits generating the clock output signals in response to the comparison signals; and
   switches responsive to the clock output signals and enabling alternate charging and discharging of the first capacitor and the second capacitor,
   wherein the first tuning circuit adjusts the reference voltage.

3. The clock circuit of claim 2, wherein the second tuning circuitry adjusts charging and discharging currents of the first capacitor and the second capacitor.

4. The clock circuit of claim 3, wherein the second tuning circuitry comprises a plurality of current mirror units biased using the reference voltage, current mirror units in the plurality of current mirror units selectable based on a third parameter.

5. The clock circuit of claim 1, wherein the switching circuit comprises:
   comparators comparing the voltages of the first node and the second node with a reference voltage and producing comparison signals;
   logic circuits generating the clock output signals in response to the comparison signals; and
   switches responsive to the clock output signals and enabling alternate charging and discharging of the first capacitor and the second capacitor,
   wherein the first tuning circuit adjusts the reference voltage in coarse steps and the second tuning circuit adjusts the reference voltage in fine steps.

6. The clock circuit of claim 1, wherein the second tuning circuitry adjusts charging and discharging currents of the first capacitor and the second capacitor.

7. The clock circuit of claim 4, wherein the second tuning circuitry comprises a plurality of current mirror units, current mirror units in the plurality of current mirror units selectable based on the third parameter.

8. A clock circuit that produces clock output signals with a clock period, comprising:
   a first capacitor and a second capacitor;
   a first node operatively coupled to the first capacitor having a voltage that is a function of charge on the first capacitor and a second node operatively coupled to the second capacitor having a voltage that is a function of charge on the second capacitor;
   a switching circuit having voltages of the first node and the second node as signal inputs and configured to alternately charge and discharge the first capacitor and the second capacitor and produce the clock output signals;
   first tuning circuitry with an adjustable resistance, the adjustable resistance of the first tuning circuitry being adjustable with a first resistance tuning step based on a first parameter; and
   second tuning circuitry with an adjustable resistance, the adjustable resistance of the second tuning circuitry being adjustable with a second resistance tuning step based on a second parameter,
   wherein the clock period of the clock output signals is dependent upon the adjustable resistance of the first tuning circuitry and the adjustable resistance of the second tuning circuitry.

9. The clock circuit of claim 8, wherein the switching circuit comprises:
   comparators comparing the voltages of the first node and the second node with a reference voltage and producing comparison signals;
   logic circuits generating the clock output signals in response to the comparison signals; and
   switches responsive to the clock output signals and enabling alternate charging and discharging of the first capacitor and the second capacitor.

10. The clock circuit of claim 9, wherein the reference voltage is dependent upon the adjustable resistance of the first tuning circuitry and the adjustable resistance of the second tuning circuitry; and
    rates of charging and discharging of the first capacitor and the second capacitor are dependent upon the reference voltage.

11. The clock circuit of claim 8, wherein the first tuning circuitry is connected in series with the second tuning circuitry.

12. The clock circuit of claim 8, wherein the first tuning circuitry comprises a plurality of first resistance units connected in series, first switches and a first decoder, first resistance units in the plurality of first resistance units selectable by the first switches responsive to signals generated by the first decoder based on the first parameter.

13. The clock circuit of claim 12, wherein the second tuning circuitry comprises a plurality of second resistance units connected in series, second switches and a second decoder, second resistance units in the plurality of second resistance units selectable by the second switches responsive to signals generated by the second decoder based on the second parameter.

14. The clock circuit of claim 13, first resistance units in the plurality of first resistance units having a lower resistance than second resistance units in the plurality of second resistance units.

15. The clock circuit of claim 8, further comprising third tuning circuitry, the third tuning circuitry adjusting charging and discharging currents of the first capacitor and the second capacitor based on a third parameter, wherein the clock period of the clock output signals is further dependent upon the adjusted charging and discharging currents of the first capacitor and the second capacitor.

16. The clock circuit of claim 15, wherein the third tuning circuitry comprises a plurality of current mirror units, third switches and a third decoder, current mirror units in the plurality of current mirror units selectable by the third switches responsive to signals generated by the third decoder based on the third parameter.

17. The clock circuit of claim 16, wherein one current mirror unit in the plurality of current mirror units is connected to the first capacitor in parallel and another current mirror unit in the plurality of current mirror units is connected to the second capacitor in parallel.

18. A clock circuit that produces clock output signals with a clock period, comprising:
- a first capacitor and a second capacitor;
- a first node operatively coupled to the first capacitor having a voltage that is a function of charge on the first capacitor and a second node operatively coupled to the second capacitor having a voltage that is a function of charge on the second capacitor;
- a switching circuit having voltages of the first node and the second node as signal inputs and configured to alternately charge and discharge the first capacitor and the second capacitor and produce the clock output signals;
- first tuning circuitry with an adjustable resistance, the adjustable resistance of the first tuning circuit being adjustable with a first resistance tuning step based on a first parameter; and
- second tuning circuitry adjusting charging and discharging currents of the first capacitor and the second capacitor based on a second parameter, wherein:
  - the clock period of the clock output signals is dependent upon the adjustable resistance of the first tuning circuitry and the adjusted charging and discharging currents of the first capacitor and the second capacitor adjusted by the second tuning circuitry.

19. The clock circuit of claim 18, wherein the switching circuit comprises:
- comparators comparing the voltages of the first and second nodes with a reference voltage and producing comparison signals;
- logic circuits generating the clock output signals in response to the comparison signals; and
- switches responsive to the clock output signals and enabling alternate charging and discharging of the first capacitor and the second capacitor.

20. The clock circuit of claim 18, wherein the second tuning circuitry comprises a plurality of current mirror units, second switches and a second decoder, current mirror units in the plurality of current mirror units selectable by the second switches responsive to signals generated by the second decoder based on the second parameter.

* * * * *